United States Patent
Nakayama et al.

(10) Patent No.: US 6,930,025 B2
(45) Date of Patent: Aug. 16, 2005

(54) TRANSPARENT CONDUCTIVE FILM FORMATION PROCESS, PHOTOVOLTAIC DEVICE PRODUCTION PROCESS, TRANSPARENT CONDUCTIVE FILM, AND PHOTOVOLTAIC DEVICE

(75) Inventors: Akiya Nakayama, Nara (JP); Hiroshi Echizen, Nara (JP); Yasuyoshi Takai, Nara (JP); Naoto Okada, Nara (JP); Shigeo Kiso, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 394 days.

(21) Appl. No.: 10/059,168

(22) Filed: Jan. 31, 2002

(65) Prior Publication Data

US 2002/0157703 A1 Oct. 31, 2002

(30) Foreign Application Priority Data

Feb. 1, 2001 (JP) ..................................... 2001-025062
Jul. 31, 2001 (JP) ..................................... 2001-230963

(51) Int. Cl.$^7$ ........................ H01L 21/20; H01L 21/36
(52) U.S. Cl. ....................... 438/478; 438/485; 438/486
(58) Field of Search ............................. 438/478, 485, 438/486; 136/243, 256

(56) References Cited

U.S. PATENT DOCUMENTS

| | | | | |
|---|---|---|---|---|
| 5,453,165 A | * | 9/1995 | Bachmann | 136/259 |
| 5,510,151 A | | 4/1996 | Matsuyama et al. | 427/509 |
| 5,549,763 A | * | 8/1996 | Sano et al. | 136/255 |
| 5,620,530 A | * | 4/1997 | Nakayama | 136/259 |
| 5,620,924 A | * | 4/1997 | Takizawa et al. | 427/108 |
| 5,981,867 A | * | 11/1999 | Toyama et al. | 136/256 |
| 5,998,730 A | | 12/1999 | Shiozaki et al. | 136/256 |
| 6,043,427 A | * | 3/2000 | Nishimoto | 136/258 |
| 6,140,570 A | | 10/2000 | Kariya | 136/256 |
| 6,172,296 B1 | * | 1/2001 | Iwasaki et al. | 136/256 |
| 6,737,123 B2 | * | 5/2004 | Kondo et al. | 427/585 |
| 6,855,621 B2 | * | 2/2005 | Kondo et al. | 438/513 |
| 6,858,308 B2 | * | 2/2005 | Kondo et al. | 428/446 |
| 2001/0051388 A1 | * | 12/2001 | Shiozaki et al. | 438/57 |
| 2003/0127127 A1 | * | 7/2003 | Inamasu et al. | 136/255 |
| 2003/0143822 A1 | * | 7/2003 | Kondo et al. | 438/485 |

FOREIGN PATENT DOCUMENTS

| | | |
|---|---|---|
| JP | 63-456 | 1/1988 |
| JP | 5-343715 | 12/1993 |
| JP | 6-116722 | 4/1994 |
| JP | 8-32094 | 2/1996 |
| JP | 10-310862 | 11/1998 |
| JP | 11-220154 | 8/1999 |

* cited by examiner

Primary Examiner—W. David Coleman
Assistant Examiner—Khiem D. Nguyen
(74) Attorney, Agent, or Firm—Fitzpatrick, Cella, Harper and Scinto

(57) ABSTRACT

In a process for forming on a substrate a transparent conductive film having crystallizability, the process comprises a first step of forming a film at a first film formation rate and a second step of forming a film at a second film formation rate, and the relationship between film formation rates in the respective steps satisfies:

2≦(second film formation rate)/(first film formation rate)≦100;

which provides a process for producing a transparent conductive film by a deposition process advantageous for cost reduction, which can form in a short time a transparent conductive film having an uneven surface profile with a high light-confining effect, and can bring about an improvement in photovoltaic performance and enjoy a high mass productivity when applied to the formation of multi-layer structure of photovoltaic devices.

14 Claims, 5 Drawing Sheets

TRANSPARENT CONDUCTIVE FILM FORMATION PROCESS, PHOTOVOLTAIC DEVICE PRODUCTION PROCESS, TRANSPARENT CONDUCTIVE FILM, AND PHOTOVOLTAIC DEVICE

BACKGROUND OF THE INVENTION

1. Field of the Invention

This invention relates to a process for forming a transparent conductive film superposed on a substrate by means of a sputtering system or the like, a process for producing a photovoltaic device, a transparent conductive film formed by that process, and a photovoltaic device making use of the transparent conductive film.

2. Related Background Art

Photovoltaic devices comprised of hydrogenated amorphous silicon, hydrogenated amorphous silicon germanium, hydrogenated amorphous silicon carbide, microcrystalline silicon, polycrystalline silicon or compound semiconductor are provided with reflecting films on the back sides of devices in order to improve collection efficiency at long wavelengths. It is desirable for such reflecting films to exhibit reflection performance effective at wavelengths which are near to energy band ends of semiconductor materials and at which their absorption is small, i.e., wavelengths of from 800 nm to 1,200 nm. Those which can well satisfy this condition are metals such as gold, silver, copper and aluminum.

An uneven layer which is optically transparent within a stated range of reflection is also provided in some cases in order to confine in a semiconductor active layer the light having entered a photovoltaic device. Such an uneven layer is commonly provided between the reflecting film formed of any of the above metals and the semiconductor active layer so that the reflected light can effectively be utilized to improve short-circuit current density Jsc. As methods by which such a transparent conductive film used as a light-confining layer is made to have an uneven surface profile, the following techniques are conventionally known.

Japanese Patent Application Laid-Open No. 63-456 discloses that, in a method of forming a film of a polycrystalline metal oxide by vacuum deposition, a film with uneven surface structure can be formed at the surface of a transparent conductive film where a metal oxide material is vacuum-deposited at a rate of 15 to 30 angstroms/second with heating.

Japanese Patent Application Laid-Open No. 8-32094 discloses that a highly reliable solar cell can be obtained where a transparent conductive film consists of at least two layers and film formation temperature and/or film formation rate is/are controlled so that one layer of them is formed as a crystalline transparent conductive film and one layer as an amorphous transparent conductive film.

Japanese Patent Application Laid-Open No. 10-310862 discloses that a reflecting film and a transparent conductive film which have the desired textural structure, have a high reflectance, are inexpensive and have a high reliability can stably be obtained where a film-forming chamber is once heated and then cooled, thereafter a metallic reflecting film is formed on a substrate, and, after active oxygen is brought into contact therewith, a transparent conductive film is formed thereon.

Japanese Patent Application Laid-Open No. 11-220154 discloses that, after a metallic reflecting film is formed on a substrate, a first transparent conductive film is formed in an atmosphere containing 50% or more of oxygen and a second transparent conductive film is formed in an atmosphere of argon and at a temperature higher than that at the time of the formation of the first transparent conductive film, so that in the first transparent conductive film the c-axes of crystal grains stand parallel to the substrate and in the second transparent conductive film the c-axes of crystal grains stand vertical to the substrate, thus a transparent conductive film the surface unevenness of which is free of any ridges can be formed and a solar cell improved in photovoltaic characteristics and having a high reliability can be obtained.

Japanese Patent Application Laid-Open No. 6-116722 discloses that a metal layer and a transparent conductive film are continuously formed by sputtering on a continuous substrate while it is moved (a roll-to-roll method).

Thus, deposited films having a certain good quality can be obtained by regulating the rate of film formation and forming the transparent conductive film in multiple layers.

However, in order to mass-produce good transparent conductive films by spurring at a low cost, there are problems as stated below which should be settled.

In order that the transparent conductive film used as a light-confining layer is grown to have an uneven surface profile which is effective for the characteristics of photovoltaic devices, the film has had to be formed by deposition in an extremely large film thickness and/or at an extremely low rate of film formation. Such a method of forming thin films has problems of a high material cost and a long film formation time, resulting in a very high production cost for the photovoltaic devices. Also, it is difficult to provide any good uneven surface profile only by simply making the film formation rate higher, undesirably bringing about an unstable sputtering discharge and a low film quality.

SUMMARY OF THE INVENTION

Accordingly, a chief object of the present invention is to provide a process for producing a transparent conductive film by a deposition process advantageous for cost reduction, which can form in a short time a transparent conductive film having an uneven surface profile with a high light-confining effect, and can bring about an improvement in photovoltaic performance and enjoy a high mass productivity when applied to the formation of multi-layer structure of photovoltaic devices.

In order to achieve both film characteristics and stability at a high level when films are formed by sputtering at a high rate, the present inventors made extensive studies especially taking note of the relationship between conditions of film formation rate, deposited-film surface profile and device construction. As the result, they have discovered that conditions of film formation rate and film thickness at the initial stage of sputtering on the substrate are effective factors for improving film characteristics and film structure of transparent conductive films and for improving device performance, and also greatly effective factors for the production of transparent conductive films in a shorter time, and have accomplished the invention having the following construction.

As an embodiment, the present invention provides a process for forming a transparent conductive film on a substrate having at least a surface layer formed of a metal layer, the process comprising:

a first step of forming a film at a first film formation rate; and a second step of forming a film at a second film formation rate;

the relationship between film formation rates in the respective steps satisfying:

2≦(second film formation rate)/(first film formation rate)≦100.

In the present invention, the term "film" is the concept which implies "nucleus".

As more preferred features, the transparent conductive film formation process of the present invention may embrace:

that, in the first step, nuclei are formed on the substrate, and, in the second step, a transparent conductive film is so formed as to cover the substrate surface and the surfaces of the nuclei over their whole area;

that, in the first step, the film is formed in a thickness of from 1 nm to 100 nm;

that, in the second step, the film is formed in a thickness of 5 μm or less, and preferably 1 μm or less;

that the process has, after the second step, a third step of forming a transparent conductive film at a third film formation rate, and the relationship between film formation rates in the respective steps satisfies:

2<(second film formation rate)/(first film formation rate)≦100;

2≦(third film formation rate)/(first film formation rate)<100; and (second film formation rate)>(third film formation rate);

that, in the third step, the film is formed in a thickness of 5 μm or less;

that the transparent conductive film is crystal;

that the transparent conductive film is formed by sputtering; and that, in the second step, a target having been subjected to pre-sputtering is used.

As another feature in the transparent conductive film formation process of the present invention, the first transparent conductive film (the film formed in the first step) may preferably be so formed that the average distance between the apexes of hills themselves of the first transparent conductive film and the average distance between the apexes of hills of the first transparent conductive film and the substrate surface are in a ratio of from 1:3 to 4:1.

As a still another feature, the transparent conductive film may preferably be formed by a roll-to-roll method in which a continuous substrate is put across rollers and transported therebetween.

The present invention also provides a process for producing a photovoltaic device, comprising the steps of forming a transparent conductive film by the transparent conductive film formation process of the present invention, and forming a semiconductor layer.

The present invention still also provides a transparent conductive film formed by the transparent conductive film formation process of the present invention.

The present invention further provides a photovoltaic device having a transparent conductive film formed by the transparent conductive film formation process of the present invention.

DESCRIPTION OF THE PREFERRED EMBODIMENTS

According to the transparent conductive film formation process according to preferred embodiments of the present invention, the ratio of film formation rates between the steps of forming transparent conductive films is controlled so that a surface profile most favorable as a back reflecting film of a photovoltaic device can be materialized and also the film formation rate of the whole transparent conductive film can be made higher, thus a transparent conductive film having an uneven surface profile with a high light-confining effect can be formed in a short time. Also, using this transparent conductive film, a photovoltaic device having a good photoelectric conversion efficiency and a high reliability can be produced at a low cost.

The present invention having the above construction and the conventional techniques described previously differ greatly from each other in conceptional and specific construction.

More specifically, the disclosure in Japanese Patent Application Laid-Open No. 63-456 concerns a technique taking note of the film formation rate, but there is no disclosure about the changing of conditions of film formation rate and the formation of films in a short time.

The disclosure in Japanese Patent Application Laid-Open No. 8-32094 takes note of a feature that the transparent conductive film is a multiple layer, but concerns combination of crystal and amorphous, and the transparent conductive film has different construction. Also, there is no disclosure at all about the changing intentionally of conditions of film formation rate during the formation of the crystal transparent conductive film. Still also, there is no disclosure about the changing of conditions of film formation rate to control the film formation rate and layer structure.

The disclosure in Japanese Patent Application Laid-Open No. 10-310862 takes note of an improvement in reflectance which is achievable by forming a transparent conductive film after the exposure of a metallic reflecting film to active oxygen, and does not suggest at all any change in surface profile which is attributable to the changing of conditions of film formation rate for the transparent conductive film.

The disclosure in Japanese Patent Application Laid-Open No. 11-220154 takes note of forming a transparent conductive film in double layer and changing film formation gas and film formation temperature, but is different from the present invention in which conditions of film formation rate are changed to attain the surface profile with a proper surface unevenness.

Embodiments of the present invention are exemplified below. The present invention is by no means limited to these examples. In the following embodiments, transparent conductive films formed in the respective steps are all so formed as to have crystallizability.

Figure 1A:
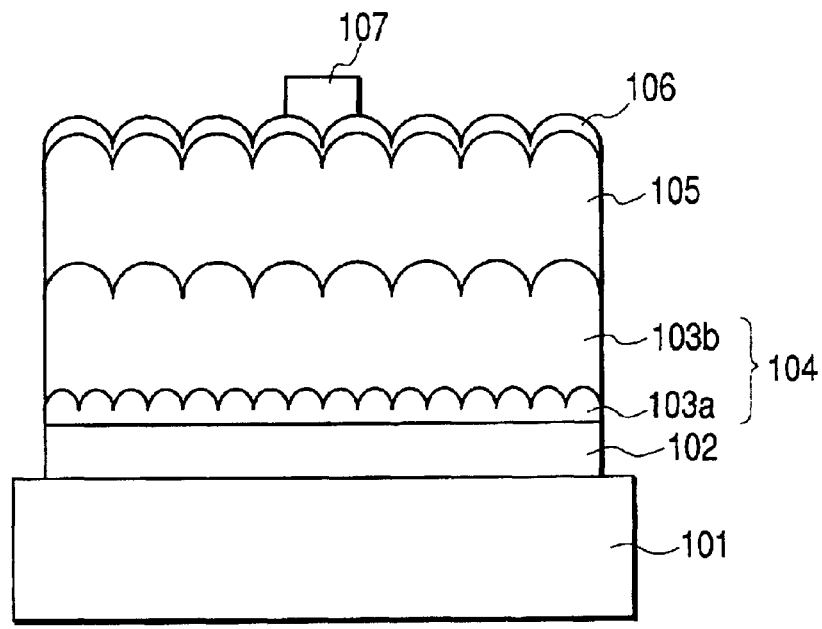
FIGS. 1A and 1B are diagrammatic views showing cross-sectional structure of examples of the photovoltaic device according to the present invention.

FIG. 1A shows cross-sectional structure of an example of the photovoltaic device according to an embodiment of the present invention, which comprises a substrate 101 and superposed thereon a reflecting film 102, a first transparent conductive film 103a, a second transparent conductive film 103b, a semiconductor layer 105, a transparent electrode 106 and a collector electrode 107 in order. The reflecting film 102, the first transparent conductive film 103a and the second transparent conductive film 103b constitute a back reflecting film 104. In the present specification, the wording "on a substrate" embraces also expression "on a film (such as a reflecting film or a metal layer) formed on a substrate".

Figure 2A:
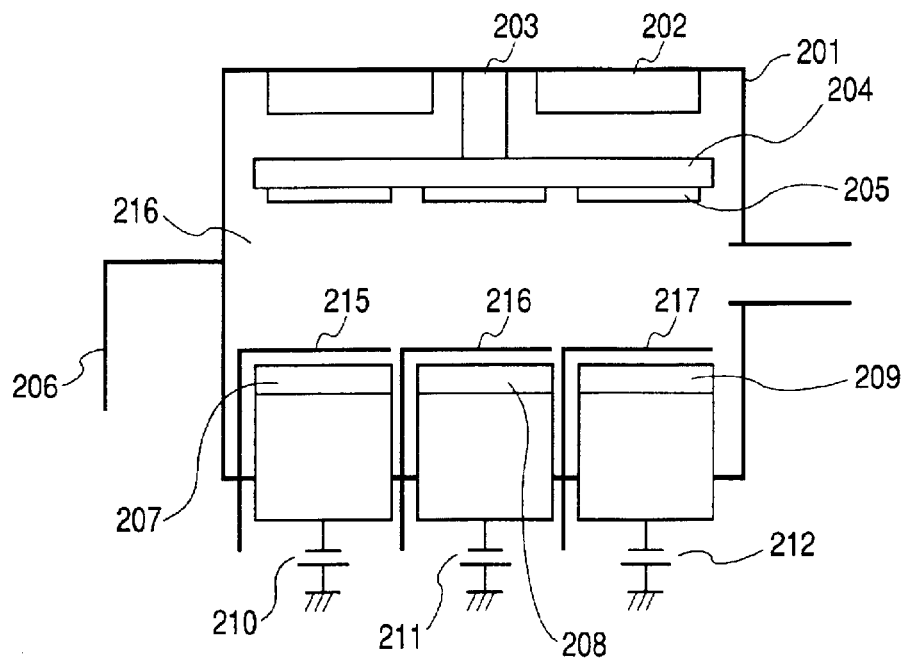
FIGS. 2A and 2B are schematic views showing examples of a production system for forming the photovoltaic device of the present invention.

FIG. 2A shows an example of a production system for forming on a substrate the photovoltaic device shown in FIG. 1A. Films are formed using this system in the following procedure.

(1) Substrates 205 are set on a substrate holder 204, and the inside of a film-forming chamber 201 is evacuated by means of a vacuum pump (not shown). Each substrate may be made of a conductive material or an electrically insulating material, or may also be an electrically insulating substrate the surface of which has been subjected to conductive treatment. It may also be a semiconductor crystal bulk. It may still also be a light-transmitting substrate such as glass. It may preferably be a substrate free of deformation or strain and having the desired strength, which may preferably include thin sheets of metals such as Fe, Ni, Cr and Al, alloys of any of these, and stainless steel, composites of any of these, and films of heat-resistant synthetic resins such as polyester and polyethylene.

(2) After the inside of the film-forming chamber 201 has been evacuated to a stated pressure, a material gas feed system (not shown) feeds argon gas thereinto through a gas feed pipe 206, and the internal pressure is regulated to a stated pressure by adjusting the valve travel of an evacuation valve (not shown). The substrate holder 204 is rotated by driving a rotating shaft 203.

(3) A plurality of infrared lamps of a heater 202 are lighted to heat the substrates to a temperature for forming a reflecting film.

(4) A DC power source 210 is switched on to cause argon plasma to take place on a target 207 for the reflecting film, and then a shutter 215 is opened to form the reflecting film 102. After the reflecting film has been deposited in a stated film thickness, the shutter 215 is closed, and the DC power source is switched off. As materials for the reflecting film, materials having a high reflectance are preferred, and may preferably be gold, silver, copper, aluminum and alloys of any of these.

(5) Next, the heater 202 is set so as to provide temperature for forming a transparent conductive film. After the substrates have been heated to a stated temperature, a DC power source 211 is switched on to cause argon plasma to take place on a target 208 for a first transparent conductive film, and then a shutter 216 is opened to deposit the first transparent conductive film. After the first transparent conductive film has been formed by a stated film thickness at a stated film formation rate, the shutter 216 is closed, and the DC power source 211 is switched off.

(6) Next, a DC power source 212 is switched on to cause argon plasma to take place on a target 209 for a second transparent conductive film, and then a shutter 217 is opened to deposit the second transparent conductive film. After the second transparent conductive film has been formed by a stated film thickness at a stated film formation rate, the shutter 217 is closed, and the DC power source 212 is switched off.

As materials for the transparent conductive films, materials having a high transmittance are preferred, and may preferably be oxides of zinc, tin, indium and titanium and composites of any of these. Also, it is effective in the present invention to optionally introduce oxygen together with the argon as a sputtering material gas of the materials for transparent conductive films, and water vapor.

Here, surface unevenness with hills of hundreds of nanometers in size can be produced at the surface of the back reflecting film 104, and the effect of scattering light can be utilized. In FIG. 1A, this surface unevenness is diagrammatically exaggeratively illustrated.

In this way, the reflecting film and the transparent conductive films can continuously be prepared on the substrate.

Using another deposition system, the semiconductor layer 105 and the transparent electrode 106 are further prepared and the collector electrode 107 is formed thereon. A protective resin may further be provided.

The transparent conductive films formed on the reflecting film prepared according to such a procedure have a surface profile having no ridges and a small density of hills, thus the reflected light is effectively absorbed in the semiconductor layer and the photoelectric conversion efficiency can be improved.

The present inventors have discovered that the film formation rate for the first transparent conductive film after the preparation of the reflecting film in the step (5) correlates with the surface profile and the photoelectric conversion efficiency of the photovoltaic device. Stated specifically, the first transparent conductive film 103a to be formed in the step (5) is formed at a low film formation rate in a short time, and the second transparent conductive film 103a is formed at a high film formation rate, controlling the ratio of these film formation rates within a specific range. This enables formation of a back reflecting film 104 more improved in photoelectric conversion efficiency, also having a superior adhesion even when deposited on a flexible substrate, being tough against any film peeling, being dense, having superior weatherability and electrical properties and having an optimum uneven surface profile.

The relationship between optimum film formation rate ratio and surface unevenness for the first transparent conductive film 103a and the second transparent conductive film 103b is described below.

According to the steps described above, back reflecting films 104 were prepared in the same manner except that the transparent conductive films were prepared setting the film formation rate of the first transparent conductive film 103a at 1 nm/sec, setting at 1:1 the ratio of the average distance between the apexes of hills themselves of the film to the average distance between the apexes of hills of the film and the substrate surface, setting the film thickness of the film to be 5 nm, and changing the film formation rate of the second transparent conductive film 103b, and the semiconductor layer, transparent electrode and collector electrode were formed to produce photovoltaic devices. To examine their initial characteristics, photoelectric conversion efficiency was measured with a solar simulator (AM 1.5, 100 mW/cm$^2$, surface temperature of 25° C.).

Figure 5:
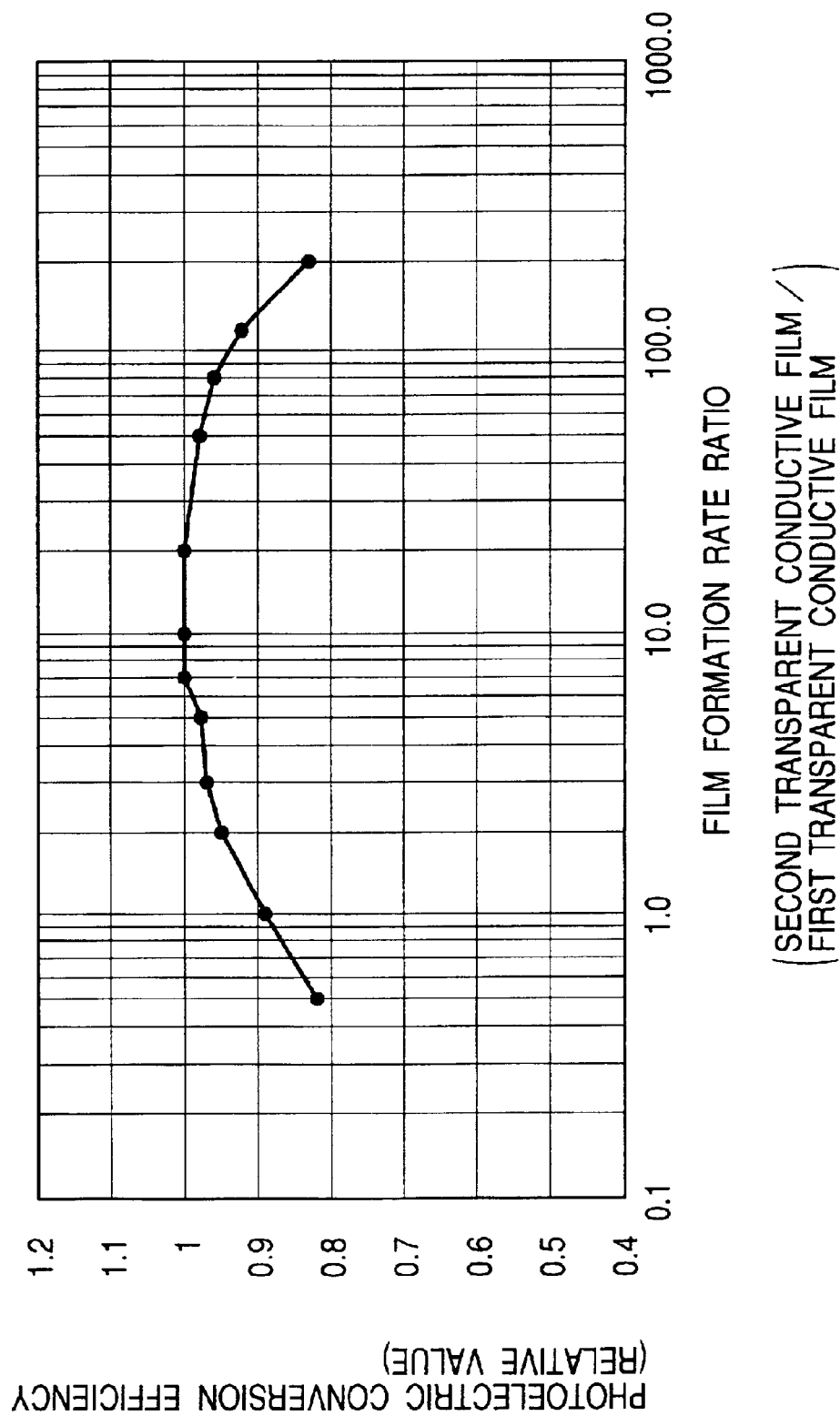
FIG. 5. is a graph showing the relationship between film formation rate ratio and photoelectric conversion efficiency in an experiment made in the present invention.

The results of measurement are shown in FIG. 5. The photoelectric conversion efficiency (relative value) is plotted as ordinate and the ratio of film formation rates (second transparent conductive film/first transparent conductive film) as abscissa. As can be seen from FIG. 5, the photoelectric conversion efficiency lowers when the ratio of film formation rates (film formation rate of second transparent conductive film 103b/film formation rate of first transparent conductive film 103a) is outside the desired range.

Next, back reflecting films 104 were prepared in the same manner as the above except that the transparent conductive films were formed in different film thickness to change their surface profile within the range of from 1:5 to 5:1 in respect of the ratio of the average distance between the apexes of hills themselves of the film to the average distance between the apexes of hills of the film and the substrate surface, and fixed to 10 the ratio of film formation rates (film formation rate of second transparent conductive film 103b/film formation rate of first transparent conductive film 103a), and the semiconductor layer, transparent electrode and collector electrode were formed to produce photovoltaic devices. To examine their initial characteristics, photoelectric conversion efficiency was measured with a solar simulator (AM 1.5, 100 mW/cm$^2$, surface temperature of 25° C.).

The results of measurement are shown in Table 1. As can be seen from Table 1, the photoelectric conversion efficiency lowers when the ratio of the average distance between the apexes of hills themselves of the film to the average distance between the apexes of hills of the film and the substrate surface is outside the desired range.

TABLE 1

Surface Profile of First Transparent Conductive Film And Photoelectric Conversion Efficiency

| a:b = | 1:5 | 1:4 | 1:3 | 1:2 | 1:1 | 2:1 | 3:1 | 4:1 | 5:1 |
|---|---|---|---|---|---|---|---|---|---|
| Photoelectric conversion efficiency: | C | C | B | A | AA | AA | A | B | C |

What letter symbols indicate (numerical value: relative value):

a: Average distance between the apexes of hills themselves of the film formed on the substrate.
b: Average distance between the apexes of hills of the film and the substrate surface.
AA: 1.00.
A: 0.95 to less than 1.
B: 0.90 to less than 0.95.
C: 0.80 to less than 0.90.

The cause of this lowering of photoelectric conversion efficiency is considered to be due to the fact that, the density of nuclei increases when the first transparent conductive film is formed at a higher rate and/or in a film thickness larger than 100 nm, so that adjoining hills tend to become connected with each other to form ridges. Also, the effect of the present invention is not obtainable when the first transparent conductive film is formed in a film thickness smaller than 1 nm. More specifically, a thin film formed thereon tends to have a larger thickness at the ridge areas than other ridge-free areas. Hence, the open-circuit voltage may lower correspondingly to such ridge areas, resulting in a lowering of photoelectric conversion efficiency as the whole device.

Little ridges are formed in the present invention, and hence the whole device can have a high open-circuit voltage. Also, in the present invention, valley lines are held in a proportion smaller than conventional ones, and hence the open-circuit voltage of the photovoltaic device can be improved.

In general, in valley areas, hill areas which surround the valley areas may be an obstacle to the particles to be sputtered, and hence the film may be formed there with difficulty. As the result, the film formed may have a small film thickness at the valley areas, and hence a leak current may occur at such microscopic areas, resulting in a lowering of open-circuit voltage of the whole device. In the present invention, however, it is considered that there are fewer valley areas and hence the open-circuit voltage may less lower.

From the above results of studies, the optimum ratio of the average distance between the apexes of hills themselves of the first transparent conductive film 103a to the average distance between the apexes of hills of the film and the substrate surface in the present embodiment may preferably be in the range of from 1:3 to 4:1, more preferably from 1:2 to 3:1, and most preferably from 1:1 to 2:1. The film thickness may preferably be in the range of from 1 to 100 nm, and more preferably from 2 to 80 nm, and most preferably 3 to 50 nm.

In the present embodiment, the controlling of the film formation rate and film thickness in the steps (5) and (6) to the above specific ranges is very important for the following reasons.

As a result of studies made by the present inventors, it has been discovered that the film formation rate and film thickness have a great influence on the surface unevenness formed at the film surface.

For example, when the film is formed at a high rate (e.g., 10 nm/sec), target's particles having been sputtered are in a large quantity and hence the particles are deposited on the substrate in a very short time, so that the hills are formed at a small distance between their apexes and also the hills are low.

The subsequent growth of the film proceeds chiefly at the hills, and hence the growth is limited to the small distance between the apexes. As the result, with an increase in film thickness with progress of the film formation, the surface unevenness at the surface of the film deposited becomes more gentle and it becomes difficult for the surface unevenness to be optimum when the film is used as, e.g., the back reflecting film of photovoltaic devices.

On the other hand, when the film is formed at a low rate (e.g., 1 nm/sec), target's particles having been sputtered are in a small quantity. Hence, the particles deposited on the substrate are fewer, and the hills are formed at a large distance between their apexes and also high. However, even in this case where the film is formed at a low rate, too, the hills are formed at a little small distance between their apexes because it takes a long time to form the film, resulting in a too large film thickness, and, with the growth of hills, additional hills become formed between adjoining hills. As the result, the surface unevenness tends to be a little gentle. This can be known from the fact that, when the first transparent conductive film described above has a film thickness larger than 100 nm, the ratio of the average distance between the apexes of hills themselves of the film to the average distance between the apexes of hills of the film and the substrate surface comes outside the desired range to cause a lowering of photoelectric conversion efficiency. Thus, it can be said that it is necessary to control the film thickness together with the film formation rate.

Even when the film is formed at a high rate, there is also a tendency that the surface unevenness becomes gentle with progress of film deposition where a sufficient surface unevenness has been formed on a film having already been deposited (i.e., an underlying layer). However, the surface unevenness can be maintained to a certain extent, and the time necessary for forming the transparent conductive film can greatly be shortened.

Hence, when, e.g., the surface unevenness necessary for the back reflecting film of photovoltaic devices is formed, a film may be deposited in a first step at a low film formation rate and in a specific film thickness to previously form a surface unevenness which is large to a certain extent, and then, in a second step a film may further be formed at a high film formation rate on the film deposited in the first step. Thus, the surface unevenness necessary for the back reflecting film of photovoltaic devices can be formed in a short time.

From the above results of studies, the optimum ratio of film formation rates for the first transparent conductive film 103a and second transparent conductive film 103b in the present embodiment may preferably be in the range of from 2 to 100, more preferably from 5 to 50, and most preferably from 7 to 20.

The first transparent conductive film in the first step may preferably be formed in a thickness ranging from 1 to 100 nm, more preferably from 2 to 80 nm, and most preferably from 3 to 50 nm. The second transparent conductive film in the second step may be formed in a thickness of 5 $\mu$m or less, preferably 1 $\mu$m or less, and more preferably 500 nm or less.

As described above, it is very important in the present invention to control the film formation rate and the film thickness simultaneously within optimum ranges.

Figure 1B:
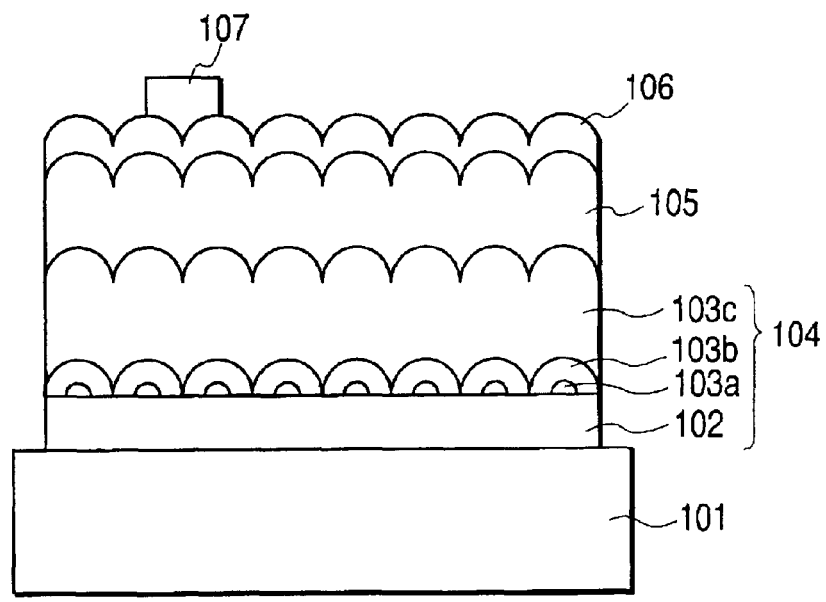

FIG. 1B shows cross-sectional structure of another example of the photovoltaic device according to another embodiment of the present invention, which comprises a substrate 101 and superposed thereon a reflecting film 102, a transparent conductive film 103 (consisting of a first-step portion (first transparent conductive film) 103a, a second-step portion (second transparent conductive film) 103b and a third-step portion (third transparent conductive film) 103c), a semiconductor layer 105, a transparent electrode 106 and a collector electrode 107 in order. The reflecting film 102 and the first transparent conductive film 103 (films 103a, 103b and 103c) constitute a back reflecting film 104.

Figure 2B:
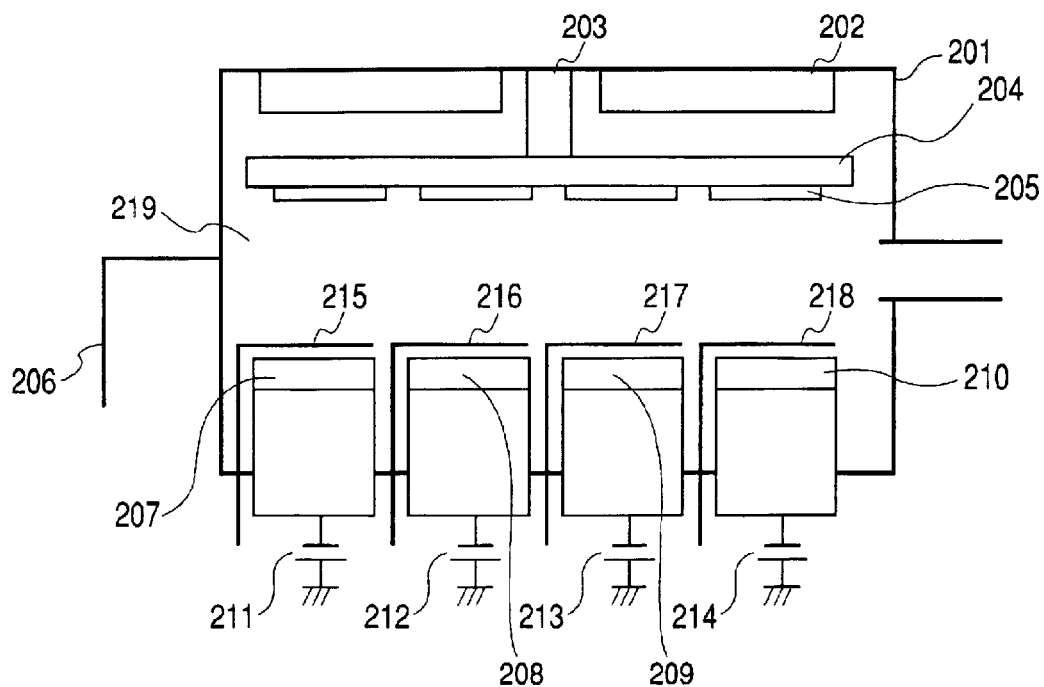

FIG. 2B shows an example of a production system for forming on a substrate the photovoltaic device shown in FIG. 1B. An example of a process for producing a photovoltaic device according to the present invention by means of this system is described below.

(1) Substrates 205 are set on a substrate holder 204, and the inside of a film-forming chamber 201 is evacuated by means of a vacuum pump (not shown). Each substrate may be made of a conductive material or an electrically insulating material, or may also be an electrically insulating substrate the surface of which has been subjected to conductive treatment. It may also be a semiconductor crystal bulk. It may still also be a light-transmitting substrate such as glass. It may preferably be a substrate free of deformation or strain and having the desired strength, which may preferably include thin sheets of metals such as Fe, Ni, Cr and Al, alloys of any of these, and stainless steel, composites of any of these, and films of heat-resistant synthetic resins such as polyester and polyethylene.

(2) After the inside of the film-forming chamber 201 has been evacuated to a stated pressure, a material gas feed system (not shown) feeds argon gas thereinto through a gas feed pipe 206, and the internal pressure is regulated to a stated pressure by adjusting the valve travel of an evacuation valve (not shown).

(3) The substrate holder 204 is rotated by driving a rotating shaft 203.

(4) A plurality of infrared lamps of a heater 202 are lighted to heat the substrates to a temperature for forming a reflecting film 102.

(5) A DC power source 211 is switched on to cause argon plasma to take place on a target 207 for the reflecting film, and then a shutter 215 is opened to form the reflecting film 102. After the reflecting film has been deposited in a stated film thickness, the shutter 215 is closed, and the DC power source is switched off. As materials for the reflecting film, materials having a high reflectance are preferred, and may preferably be gold, silver, copper, aluminum and alloys of any of these.

(6) Next, the heater 202 is set so as to provide temperature for forming a transparent conductive film. After the substrates have been heated to a stated temperature, a DC power source 212 is switched on to cause argon plasma to take place on a target 208 used for a first step in forming the transparent conductive film, and then a shutter 216 is opened to form the first-step portion (nuclei; herein regarded as the first transparent conductive film) 103a of the transparent conductive film 103. After the nuclei have been formed by a stated size at a stated film formation rate, the shutter 216 is closed, and the DC power source 212 is switched off.

(7) Next, a DC power source 213 is switched on to cause argon plasma to take place on a target 209 used for a second step in forming the transparent conductive film, and then a shutter 217 is opened to deposit the second-step portion 103b of the transparent conductive film 103. After the second-step portion has been formed by a stated film thickness at a stated film formation rate, the shutter 217 is closed, and the DC power source 213 is switched off.

(8) Next, a DC power source 214 is switched on to cause argon plasma to take place on a target 210 used for a third step in forming the transparent conductive film, and then a shutter 218 is opened to deposit the third-step portion 103c of the transparent conductive film 103. After the third-step portion has been formed by a stated film thickness at a stated film formation rate, the shutter 218 is closed, and the DC power source 214 is switched off.

As materials for the transparent conductive film, materials having a high transmittance are preferred, and may preferably be oxides of zinc, tin, indium and titanium and composites of any of these. Also, it is effective in the present invention to optionally introduce oxygen together with the argon as a sputtering material gas of the materials for transparent conductive film, and water vapor.

Here, surface unevenness with hills of hundreds of nanometers in size can be produced at the surface of the back reflecting film 104, and the effect of scattering light can be utilized. In FIG. 1B, this surface unevenness is diagrammatically exaggeratively illustrated.

In this way, the reflecting film 102 and the transparent conductive film 103 (layers 103a to 103c) can continuously be prepared on the substrate. Using another deposition system, the semiconductor layer 105 and the transparent electrode 106 are further prepared and the collector electrode 107 is formed thereon. A protective resin may further be provided.

The transparent conductive film 103 (layers 103a to 103c) prepared according to such a procedure has an uneven surface profile, thus the reflected light is effectively absorbed in the semiconductor layer 105 and the photoelectric conversion efficiency can be improved.

In such a method of forming the transparent conductive film 103 (layers 103a to 103c), it is characterized in the present embodiment, too, to control conditions of its film formation rate.

Stated specifically, the first-step portion 103a of the transparent conductive film, formed in a first step, the step (6), is formed at a low film formation rate in a short time. Thus, the nuclei, which finally serving as bases of hills of the transparent conductive film, can be formed in the desired density.

Next, in a second step, the step (7), the second-step portion 103b is formed at a high film formation rate. In this step, the nuclei formed in the first step are made to grow rapidly, without damaging the density of nuclei. At the stage where the matter thus formed covers the whole surfaces of the nuclei formed in the first step, i.e., the matter formed is transformed from nuclei to a film, the process proceeds to a third step, the step (8).

In the third step, the third-step portion 103c is formed at a film formation rate which is higher than that in the first step and lower than that in the second step. The film formation at a rate higher than that in the first step enables the film formation time for the whole film to be shortened while keeping any new nuclei from being formed at the valleys of the film. Also, the film formation at a rate lower than that in the second step enables formation of the film in a denser film quality.

Here, the first step and the second step in the present embodiment are the step of forming nuclei and the step of glowing the nuclei, respectively, and the matter formed can be said to be a film with difficulty. Accordingly, in a strict meaning, it is not suitable to refer to "film formation rate" in the first step and second step. Hence, the film formation rate referred to in the present embodiment is defined to be the rate of film formation when all the underlying surfaces are compositionally the same as the film (i.e., the thickness of a film become deposited per unit time). In other words, it refers to the rate of film formation when the deposits on the substrate are transformed from island-like nuclei to a film and the deposits grow uniformly into a film over the whole surface. This is the film formation rate in the step corresponding to the third step in the present embodiment. Thus, the first to third steps can be compared by film formation rate commonly used. The factors that determine the film formation rate may commonly include the voltage and electric current applied to targets, the composition and concentration of sputtering gases, the temperature and pressure in the film-forming chamber, and the composition and surface properties of targets. In the present invention, these may appropriately be controlled so that the desired film formation rate may consequently be achieved.

Thus, controlling the ratio of film formation rates between the respective steps within a specific range enables formation of a back reflecting film 104 more improved in photoelectric conversion efficiency, also having a superior adhesion even when deposited on a flexible substrate, being tough against any film peeling, being dense, having superior weatherability and electrical properties and having an optimum uneven surface profile.

The relationship between optimum film formation rate ratio and surface unevenness in the respective steps in the present embodiment is described below.

As a result of studies made by the present inventors, it has been discovered that the film formation rate and film thickness in the steps of forming the transparent conductive film greatly influence the unevenness formed finally at the film surface.

For example, when the film is formed at a high rate (e.g., 10 nm/sec or more) from the first step, i.e., the step of forming nuclei, target's particles having been sputtered are in a large quantity and hence the particles are deposited on the substrate in a very short time and also in a high density of nuclei. Hence, the nuclei are formed at a small distance between them, and the nuclei come small in height because the target's particles contribute to the growth of nuclei in a dispersed state. Thereafter, the part of nuclei comes to hills as the film is formed on, and hence the small distance between the nuclei is maintained as it is, as the distance between hills of the film. As the result, with an increase in film thickness with progress of the film formation, the unevenness at the surface of the film deposited becomes more gentle and it becomes difficult for the film to have the optimum uneven surface profile when the film is used as, e.g., the back reflecting film of photovoltaic devices. However, even when the film is formed at a high rate, the uneven surface profile can be maintained to a certain extent, although there is a tendency that the surface unevenness becomes gentle with progress of film deposition where a sufficient surface unevenness has been formed on a film having already been deposited as in the second and third steps in the present embodiment.

When the film is formed at a high rate, the time necessary for forming the transparent conductive film can also greatly be shortened. In view of the denseness of the film, however, it is better for the film formation rate to be low. Especially in respect of the transparent conductive film coming into contact with the semiconductor layer, like the film of the third step, it is better for its surface to have a denser structure. If the surface is not dense, cracks or the like may occur to cause a lowering of open-circuit voltage of the whole device due to a leak current caused by such cracks. In view of adhesion, too, it is better for the transparent conductive film surface to have dense structure.

In addition, where the film formation rate is set high by controlling various factors which determine the above film formation rate, any sputtering discharge may not rise or, even if it rises, a phenomenon of short circuit may occur in the middle of film formation to make the discharge intermit, or make the discharge stop as it is. This phenomenon of short circuit refers to a phenomenon in which a voltage flows abnormally during discharge to make the discharge unstable or make the discharge break off temporarily. Once the phenomenon of short circuit has occurred, it may cause a decrease in film formation rate on the contrary or may have bad influences such as a lowering of film quality due to non-uniform film thickness distribution or film defects. Hence, this matters a great deal especially when films are continuously formed. The occurrence of the phenomenon of short circuit may further make the discharge not rise as it is, without any self reversion. This matters a great deal also in respect of productivity.

Accordingly, in the step having a great influence on the formation of surface unevenness of the film as in the second step of the present embodiment, it is better for the film formation rate to be set as high as possible in order to maintain the density of the nuclei formed in the first step and transform them into a film rapidly and in a short time. In the step which does not so much influence the formation of surface unevenness of the film and in which the film is deposited until it has the desired film thickness, as in the third step, it is better to set optimum conditions for film formation in view of the balance between film quality, film formation time and discharge stability.

On the other hand, when the film is formed at a low rate (e.g., 1 nm/sec), target's particles having been sputtered are in a small quantity and hence the particles deposited on the substrate are fewer and also in a low density of nuclei. Hence, the nuclei are formed at a large distance between them, and the growth of nuclei proceeds concentratedly on the nuclei formed, so that the nuclei come high. However, even in this case where the film is formed at a low rate, too, the nuclei are formed at a small distance between them because, as the film formation time becomes longer, additional nuclei become formed between adjoining nuclei with the growth of nuclei. As the result, the surface unevenness of the film comes gentle. This tendency is remarkable when the nuclei formed in the step of forming nuclei (the first step) has a thickness larger than 100 nm. Also, when the film is formed at a low rate, it inevitably takes a time to deposit the transparent conductive film until it has the desired film thickness, leaving a problem on productivity.

In order to form the film under stable conditions of film formation rate immediately after the start of discharging, it is preferable to use a target having been subjected to pre-sputtering. When a virgin target is used, the target changes in surface properties between the one immediately after the start of discharging and immediately before the completion of discharging, and the conditions of film formation rate change on with time. On the other hand, the target having been subjected to pre-sputtering has originally a surface standing rough appropriately, and hence the conditions of film formation rate immediately after the start of discharging and immediately before the completion of discharging can be made alike. In the first step, having a low film formation rate, and in the third step, having not so much influence on the uneven surface profile of the film even if the film formation rate deflects more or less, the stability of this film formation rate does not especially matter so much. However, this stability is greatly effective in the second step, which is a step important for the formation of surface unevenness of the film.

Accordingly, when, e.g., the surface unevenness necessary for the back reflecting film of photovoltaic devices is formed, the following film formation method is most preferred in which the conditions of film formation rate are changed for each step.

First, in the first step, nuclei with a specific size are formed under conditions of a low film formation rate. Next, in the second step, the nuclei are made to grow rapidly under conditions of a high film formation rate using a target having been subjected to pre-sputtering, and made to transform swiftly from the state of nuclei to the state of a film. Finally, in the third step, the film is formed under conditions of a film formation rate a little lower than that in the second step, thus a denser film can be formed. The time taken to form the film can also be shortened as a whole, and the surface unevenness and film quality necessary for the back reflecting film of photovoltaic devices can be obtained.

As a result of studies made by the present inventors, the optimum ratio of film formation rates between the second step and the first step and between the third step and the first step may preferably be in the range of from 2 to 100, more preferably from 5 to 50, and most preferably from 7 to 20. Also, the third step may be under conditions of a film formation rate lower than the second step, where the optimum ratio of film formation rates between the second step and the third step may preferably be in the range of from 1 to 10, more preferably from 1 to 3, and most preferably from 1.1 to 2.

The film (nuclei) in the first step may preferably be formed in a thickness ranging from 1 to 100 nm, more preferably from 2 to 80 nm, and most preferably from 3 to 50 nm. If it is in a thickness smaller than 1 nm, any function as the nuclei can not be achieved and any effect of the present invention can not be obtained. If it is larger than 100 nm, the nuclei may be in so high a density as to make it difficult for the transparent conductive film to have the desired uneven surface profile.

The film in the second step may be formed in a thickness of 5 $\mu$m or less, preferably 1 $\mu$m or less, and more preferably 500 nm or less. In this thickness, the transformation from the state of nuclei to the state of a film is substantially completed, and the uneven surface profile intended in the second step can be provided.

The thickness of the film formed in the third step greatly influences the characteristics of the final products photovoltaic devices, and may preferably be 5 $\mu$m or less taking account of strain resistance, impact resistance and adhesion.

Incidentally, a batch method is shown here as an example. Without limitation to this method, the present invention may also be applied to a sheet-by-sheet method or a method in which a continuous substrate is transported, such as a roll-to-roll method.

The present invention is described below in greater detail by giving Examples and with reference to the accompanying drawings. The present invention is by no means limited to these Examples.

EXAMPLE 1

In this Example, the photovoltaic device having the construction shown in the FIG. 1A cross-sectional diagrammatic view was produced by means of the system shown in FIG. 2A.

To state specifically, thin substrates 205 made of stainless steel were set on the substrate holder 204, and the inside of the film-forming chamber 201 was evacuated by means of a vacuum pump (not shown). After the inside of the film-forming chamber 201 was evacuated to a stated pressure, the material gas feed system (not shown) fed 30 sccm of argon gas thereto through the gas feed pipe 206, and the internal pressure was regulated to 0.3 Pa by adjusting the valve travel of an evacuation valve (not shown). Then the substrate holder 204 was rotated by driving the rotating shaft 203. The heater 202 was so set that the substrates were heated to 100° C., and the infrared lamps were lighted to heat the substrates. After the substrates came to the stated temperature, the DC power source 210 was switched on to cause argon plasma to take place on an aluminum target 207 for the reflecting film, and then the shutter 215 was opened to form the reflecting film 102. The reflecting film 102 was deposited in a thickness of about 150 nm. Then the shutter 215 was closed, and the DC power source was switched off.

Next, the heater 202 was so set that the substrates were heated to 200° C. After the substrates came to the stated temperature, the DC power source 211 was switched on to cause argon plasma to take place on a zinc oxide target 208 for the first transparent conductive film, and then the shutter 216 was opened to form the first transparent conductive film. The first transparent conductive film was deposited in a film thickness of about 8 nm at a film formation rate of 0.5 nm/sec. Then the shutter 216 was closed, and the DC power source 211 was switched off.

Next, the DC power source 212 was switched on to cause argon plasma to take place on a zinc oxide target 209 for the second transparent conductive film, and then the shutter 217 was opened to form the second transparent conductive film 103b. The second transparent conductive film 103b was deposited at a film formation rate of 10 nm/sec in a film thickness of about 1 $\mu$m. Then the shutter 217 was closed, and the DC power source 212 was switched off.

The ratio of film formation rates for the first transparent conductive film and second transparent conductive film was 20. Each substrate with the reflecting film and transparent conductive films formed thereon was observed on an AFM (atomic-force microscope) to ascertain that there were about 60 hills per 25 $\mu$m$^2$. The substrate with the reflecting film and transparent conductive films formed thereon was cut in a size of 5 cm×5 cm, and the semiconductor layer, transparent electrode and collector electrode were deposited by means of a different system to produce the photovoltaic device.

COMPARATIVE EXAMPLE 1

Figure 3:
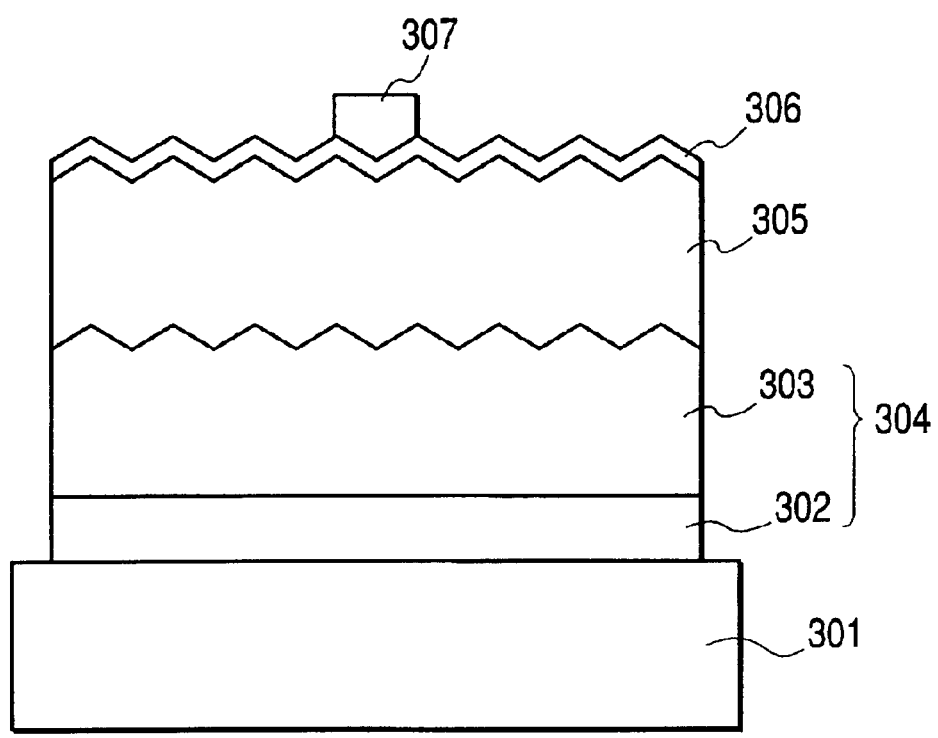
FIG. 3 is a diagrammatic view showing cross-sectional structure of a photovoltaic device made in Comparative Examples.

A photovoltaic device having the construction shown in FIG. 3 was produced in the same manner as in Example 1 except that the first and second transparent conductive films in Example 1 were formed under the conditions for forming the second transparent conductive film, to form a transparent conductive film 303. The substrate with the reflecting film and transparent conductive film formed thereon was observed on an AFM to ascertain that there were about 140 hills per 25 $\mu m^2$. In FIG. 3, reference numeral 310 denotes a substrate; 302, the reflecting film; 303, the transparent conductive film; 304, a back reflecting film consisting of the reflecting film 302 and the transparent conductive film 303; 305, a semiconductor layer; 306, a transparent electrode; and 307, a collector electrode.

Evaluation 1

On the photovoltaic device obtained in Example 1 (hereinafter "Ex.1 sample") and the photovoltaic device obtained in Comparative Example 1 (hereinafter "Cp.1 sample") each, the photoelectric conversion efficiency was measured with a solar simulator (AM 1.5, 100 mW/cm$^2$, surface temperature of 25° C.) to examine their initial characteristics. As the result, the Ex.1 sample was found to be superior to the Cp.1 sample by 1.12 times.

EXAMPLE 2

A photovoltaic device having the construction shown in FIG. 1A was produced in the same manner as in Example 1 except that the second transparent conductive film formed therein was formed in a thickness of about 2 $\mu$m. The substrate with the reflecting film and transparent conductive films formed thereon was observed on an AFM to ascertain that there were about 55 hills per 25 $\mu m^2$.

COMPARATIVE EXAMPLE 2

A photovoltaic device having the construction shown in FIG. 3 was produced in the same manner as in Example 2 except that the first and second transparent conductive films in Example 2 were formed under the conditions for forming the second transparent conductive film, to form a transparent conductive film 303. The substrate with the reflecting film and transparent conductive film formed thereon was observed on an AFM to ascertain that there were about 130 hills per 25 $\mu m^2$.

Evaluation 2

Evaluation was made by the same measurement as that on the photovoltaic devices obtained in Example 1 and Comparative Example 1. As the result, the photovoltaic device obtained in Example 2 was found to have a superior photoelectric conversion efficiency like the photovoltaic device obtained in Example 1.

EXAMPLE 3

Figure 4A:
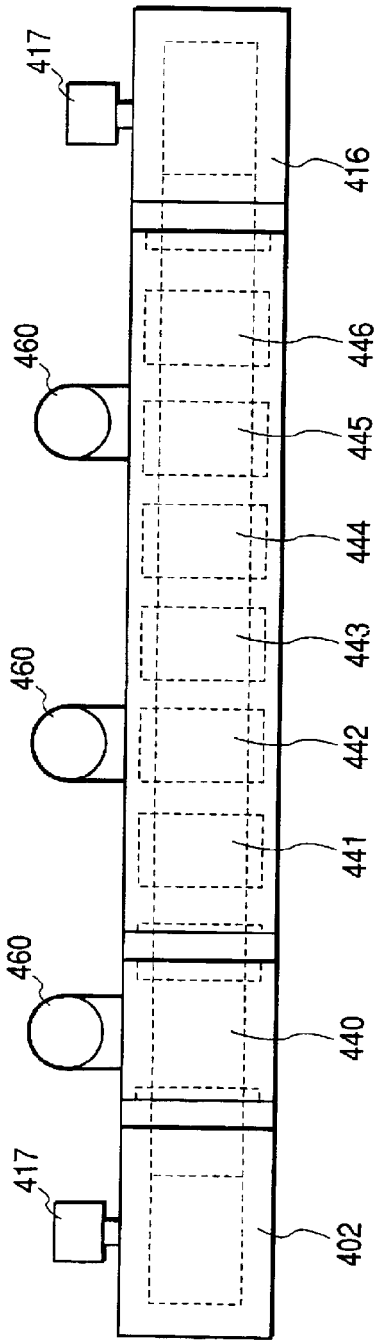
FIGS. 4A and 4B are schematic views showing an example of the production system of a roll-to-roll method, used for forming the photovoltaic device of the present invention on a continuous substrate.
Figure 4B:
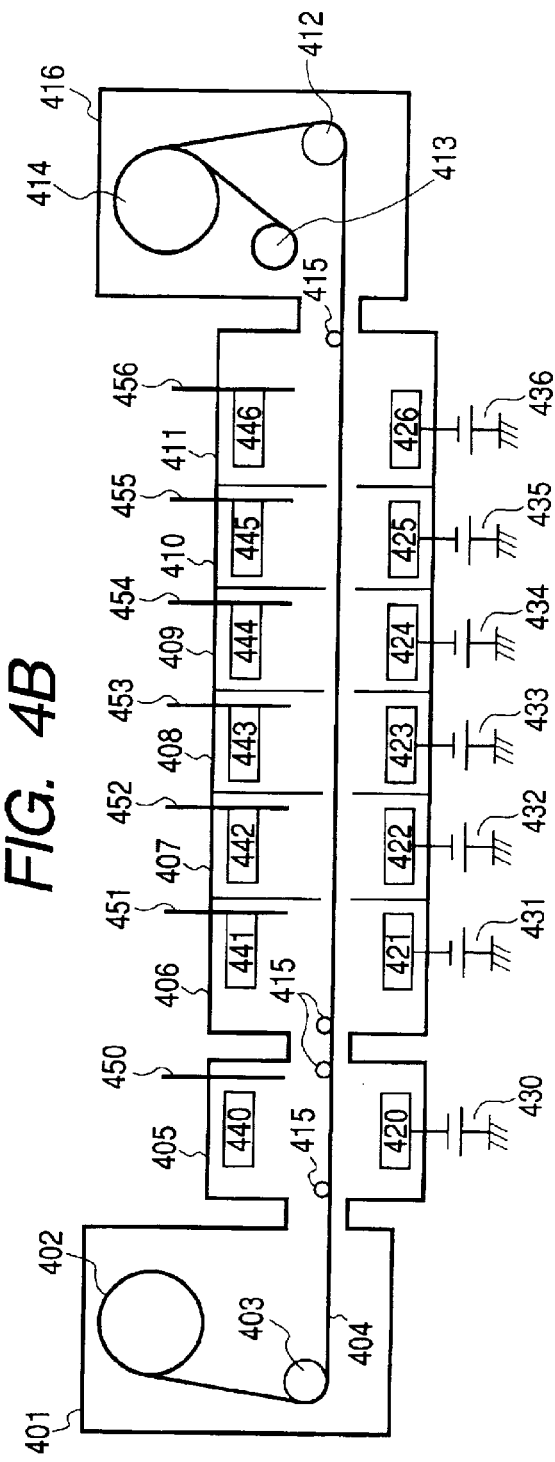

In this Example, the photovoltaic device having the construction shown in the FIG. 1A cross-sectional diagrammatic view was produced by means of a system shown in FIGS. 4A and 4B. FIG. 4A is a top plan view, and FIG. 4B a front view.

The system shown in FIGS. 4A and 4B was opened to the atmosphere for the purpose of maintenance and so forth. Thereafter, a rolled continuous substrate 402 was set in a substrate wind-off chamber 401. A wound-off substrate 404 was put to pass through a reflecting-film-forming chamber 405 and transparent-conductive-film-forming chambers 406, 407, 408, 409, 410 and 411 each, and was fixed to a roll 414 in a substrate wind-up chamber 416. As the substrate 404, used was a SUS430 stainless steel sheet of 120 mm wide, 0.15 mm thick and 150 m long, having been dull-finished to provide its surface with unevenness.

Subsequently, the insides of these chambers were evacuated until the pressure came to 0.1 Pa or below. Thereafter, into the reflecting-film-forming chamber 405 and transparent-conductive-film-forming chambers 406, 407, 408, 409, 410 and 411, 30 scam each of argon gas was fed as an inert gas through gas feed pipes 450, 451, 452, 453, 454, 455 and 456, respectively. Also, 30 sccm of argon gas was fed into gates 415. In this state, the valve travel of an evacuation valve (not shown) was adjusted to keep the internal pressure of the vacuum chambers to 0.3 Pa.

The reflecting-film-forming chamber 405 and transparent-conductive-film-forming chambers 406, 407, 408, 409, 410 and 411 were beforehand provided with heater units 440, 441, 442, 443, 444, 445 and 446, respectively, together with reflecting plates made of stainless steel, and thermocouples were brought into contact with the substrate 404 on its side opposite to the film formation side, i.e., on the back side to heat the substrate, controlling its temperature to come to 200° C.

Subsequently, a survo motor was operated to rotate the wind-up roll 414 to start transporting the substrate 404.

As a target 420 for forming the reflecting film, an aluminum target with a purity of 99.99% and of 25 cm×25 cm in size was used. Electric power was applied from a DC power source 430 to this target to cause argon plasma to take place thereon, to deposit the reflecting film. In the course where the substrate 404 passed over the target 420, an aluminum reflecting film 102 (FIG. 1A) was deposited in a thickness of about 150 nm.

The substrate 404 was successively transported to the film-forming chamber 406 for forming the first transparent conductive film. Electric power was applied from a DC power source 431 to a zinc oxide target 421 with a purity of 99.99% and of 25 cm×25 cm in size to cause argon plasma to take place thereon, to form the first transparent conductive film 103a at a film formation rate of 0.5 nm/sec.

Then the substrate 404 was successively transported to the film-forming chambers 407, 408, 409, 410 and 411 for forming the second transparent conductive film. Electric power was applied from DC power sources 432, 433, 434, 435 and 436 to zinc oxide targets 422, 423, 424, 425 and 426, respectively, each with a purity of 99.99% and of 25 cm×25 cm in size to cause argon plasma to take place thereon, to form the second transparent conductive film 103b at a film formation rate of 10 nm/sec. The second transparent conductive film 103b was in a film thickness of about 1 $\mu$m. Here, this transparent conductive film was formed in the surface profile shown in FIG. 1A.

The substrate 404 on which the films up to the second transparent conductive film were formed was wound up in the wind-up chamber 416. Also, when it was wound up, a synthetic paper 413 comprised of polyester film was fed to the substrate so as to be interposed between its surface and back so that the surface of the second transparent conductive film was not scratched.

The ratio of film formation rates for the first transparent conductive film and second transparent conductive film was 20. The substrate with the reflecting film and transparent conductive films formed thereon was observed on an AFM to ascertain that there were about 60 hills per 25 $\mu m^2$. The substrate with the reflecting film and transparent conductive films formed thereon was cut in a size of 5 cm×5 cm, and the semiconductor layer, transparent electrode and collector electrode were deposited by means of a different system to produce the photovoltaic device.

COMPARATIVE EXAMPLE 3

A photovoltaic device having the construction shown in FIG. 3 was produced in the same manner as in Example 3 except that the first and second transparent conductive films in Example 3 were formed under the conditions for forming the second transparent conductive film, to form a transparent conductive film 303. The substrate with the reflecting film and transparent conductive film formed thereon was observed on an AFM to ascertain that there were about 140 hills per 25 $\mu m^2$.

Evaluation 3

On the photovoltaic device obtained in Example 3 (hereinafter "Ex.3 sample") and the photovoltaic device obtained in Comparative Example 3 (hereinafter "Cp.3 sample") each, the photoelectric conversion efficiency was measured with a solar simulator (AM 1.5, 100 mW/cm$^2$, surface temperature of 25° C.) to examine their initial characteristics. As the result, the Ex.3 sample was found to be superior to the Cp.3 sample by 1.12 times.

EXAMPLE 4

In this Example, the photovoltaic device having the construction shown in the FIG. 1B cross-sectional diagrammatic view was produced by means of the system shown in FIG. 2B.

To state specifically, substrates 205 made of stainless steel were set on the substrate holder 204, and the inside of the film-forming chamber 201 was evacuated by means of a vacuum pump (not shown). After the inside of the film-forming chamber 201 was evacuated to a stated pressure, the material gas feed system (not shown) fed 30 sccm of argon gas thereto through the gas feed pipe 206, and the internal pressure was regulated to 0.3 Pa by adjusting the valve travel of an evacuation valve (not shown). Then the substrate holder 204 was rotated by driving the rotating shaft 203.

The heater 202 was so set that the substrates were heated to 100° C., and the infrared lamps were lighted to heat the substrates. After the substrates came to the stated temperature, electric power was applied from the DC power source 211 to an aluminum target 207 for the reflecting film to cause argon plasma to take place thereon, and then the shutter 215 was opened to form the reflecting film 102. The reflecting film was deposited in a thickness of about 150 nm. Then the shutter 215 was closed, and the DC power source 211 was switched off.

Next, the heater 202 was so set that the substrates were heated to 200° C. After the substrates came to the stated temperature, electric power was applied from the DC power source 212 to a zinc oxide target 208 used for the first step in forming the transparent conductive film, to cause argon plasma to take place thereon, and then the shutter 216 was opened to form the nuclei (first-step portion 103a of the transparent conductive film). The film formation rate in the first step was set at 0.5 nm/sec. (This film formation rate refers to the rate of film formation when the underlying layer is the zinc oxide film.) After the nuclei formed in this first step came to a height of about 8 nm, the shutter 216 was closed, and the DC power source 212 was switched off.

Next, electric power was applied from the DC power source 213 to a zinc oxide target 209 used for the second step, to cause argon plasma to take place thereon, and then the shutter 217 was opened to form the second-step portion 103b of the transparent conductive film. Here, a target having been subjected to pre-sputtering was used as the zinc oxide target 209 used for the second step. The film formation rate in the second step was set at 10 nm/sec. The deposits became transformed from the state of nuclei to the state of a film, and a transparent conductive film was deposited in a thickness of about 150 nm, where the shutter 217 was closed, and the DC power source 213 was switched off. The ratio of film formation rates between the second step and the first step was 20.

Next, electric power was applied from the DC power source 214 to a zinc oxide target 210 used for the third step, to cause argon plasma to take place thereon, and then the shutter 218 was opened to form the third-step portion 103c of the transparent conductive film. The film formation rate in the third step was set at 8 nm/sec. The transparent conductive film was deposited in a thickness of about 1.5 $\mu m$, where the shutter 218 was closed, and the DC power source 214 was switched off. The ratio of film formation rates between the third step and the first step was 16.

The substrate with the reflecting film 102 and transparent conductive film 103 (103a to 103c) formed thereon was cut in a size of 5 cm×5 cm, and the semiconductor layer 105, transparent electrode 106 and collector electrode 107 were deposited by means of a different system to produce the photovoltaic device.

EXAMPLE 5

In this Example, the photovoltaic device having the construction shown in the FIG. 1B cross-sectional diagrammatic view was produced by means of the system shown in FIGS. 4A and 4B.

The system shown in FIGS. 4A and 4B was opened to the atmosphere for the purpose of maintenance and so forth. Thereafter, a rolled continuous substrate 402 was set in a substrate wind-off chamber 401. A wound-off substrate 404 was put to pass through a reflecting-film-forming chamber 405 and transparent-conductive-film-forming chambers 406, 407, 408, 409, 410 and 411 each, and was fixed to a roll 414 in a substrate wind-up chamber 416. As the substrate 404, used was a SUS430 stainless steel sheet of 120 mm wide, 0.15 mm thick and 150 m long, having been dull-finished to provide its surface with unevenness.

Subsequently, the insides of the film-forming chambers were evacuated until the pressure came to 0.1 Pa or below. Thereafter, into the reflecting-film-forming chamber 405 and transparent-conductive-film-forming chambers 406, 407, 408, 409, 410 and 411, 30 sccm each of argon gas was fed as an inert gas through gas feed pipes 450, 451, 452, 453, 454, 455 and 456, respectively. In this state, the valve travel of an evacuation valve (not shown) was adjusted to keep the internal pressure of the film-forming chambers to 0.3 Pa.

The reflecting-film-forming chamber 405 and transparent-conductive-film-forming chambers 406, 407, 408, 409, 410 and 411 were beforehand provided with heater units 440, 441, 442, 443, 444, 445 and 446, respectively, together with reflecting plates made of stainless steel, and thermocouples were brought into contact with the substrate 404 on its side opposite to the film formation side, i.e., on the back side to heat the substrate, controlling its temperature to come to 200° C.

Subsequently, a survo motor was operated to rotate the wind-up roll 414 to start transporting the substrate 404.

As a target 420 for forming the reflecting film, an aluminum target with a purity of 99.99% and of 25 cm×25 cm in size was used. Electric power was applied from a DC power source 430 to this target 420 to cause argon plasma to take place thereon, to deposit the reflecting film 102. Thus, in the course where the substrate 404 passed over the target 420, an aluminum reflecting film 102 (FIG. 1B) was formed in a thickness of about 150 nm.

The substrate 404 was successively transported to the film-forming chamber 406 corresponding to the first step in the formation of the transparent conductive film. Electric power was applied from a DC power source 431 to a zinc oxide target 421 with a purity of 99.99% and of 25 cm×25 cm in size to cause argon plasma to take place thereon, to form the first-step portion 103*a* at a film formation rate of 0.5 nm/sec. In the course where the substrate 404 passed over the target 421, nuclei of zinc oxide grew to have a thickness of about 8 nm.

Then the substrate 404 was successively transported to the film-forming chamber 407 corresponding to the second step in the formation of the transparent conductive film. Electric power was applied from a DC power source 432 to a zinc oxide target 422 with a purity of 99.99% and of 25 cm×25 cm in size, having been subjected to pre-sputtering, to cause argon plasma to take place thereon, to form the second-step portion 103*b* under conditions of a film formation rate of 10 nm/sec. In the course where the substrate 404 passed over the target 422, a zinc oxide film grew to have a thickness of about 100 nm.

Next, the substrate 404 was successively transported to the film-forming chambers 408, 409, 410 and 411 corresponding to the third step in the formation of the transparent conductive film. Electric power was applied from DC power sources 433, 434, 435 and 436 to zinc oxide targets 423, 424, 425 and 426, respectively, each with a purity of 99.99% and of 25 cm×25 cm in size to cause argon plasma to take place thereon, to form the third-step portion 103*c* under conditions of a film formation rate of 8 nm/sec. At the stage where the third step was completed, the second transparent conductive film 103*b* was in a film thickness of about 1.5 $\mu$m.

The substrate 404 with the back reflecting film 104 (the reflecting film 102 and the transparent conductive films 103*a* to 103*c*) having been formed thereon was wound up in the wind-up chamber 416. Also, when it was wound up, a synthetic paper 413 comprised of polyester film was fed to the substrate so as to be interposed between its surface and back so that the surface of the transparent conductive film was not scratched.

The ratio of film formation rates between the second and first steps in the formation of the transparent conductive film was 20, and the ratio of film formation rates between the third and first steps was 16.

The substrate with the back reflecting film 104 formed thereon in the manner described above was cut in a size of 5 cm×5 cm, and the semiconductor layer 105, transparent electrode 106 and collector electrode 107 were deposited by means of a different system to produce the photovoltaic device.

EXAMPLE 6

A photovoltaic device having the construction shown in FIG. 1B was produced in the same manner as in Example 4 except that, in the formation of the transparent conductive film in Example 4, the film in the third step was formed under the conditions in the second step.

EXAMPLE 7

A photovoltaic device having the construction shown in FIG. 1B was produced in the same manner as in Example 4 except that, in the formation of the transparent conductive film in Example 4, a virgin target was used in the second step in place of the target having been subjected to pre-sputtering.

COMPARATIVE EXAMPLE 4

A photovoltaic device having the construction shown in FIG. 3 was produced in the same manner as in Example 4 except that, in the formation of the transparent conductive film in Example 4, all the steps were carried out under the conditions in the second step to form a transparent conductive film 303.

COMPARATIVE EXAMPLE 5

A photovoltaic device having the construction shown in FIG. 1B was produced in the same manner as in Example 4 except that, in the formation of the transparent conductive film in Example 4, the condition of film formation rate in the first step was changed to 0.08 nm/sec.

COMPARATIVE EXAMPLE 6

A photovoltaic device having the construction shown in FIG. 3 was produced in the same manner as in Example 5 except that, in the formation of the transparent conductive film in Example 5, all the steps were carried out under the conditions in the second step to form a transparent conductive film 303.

Evaluation 4

On the photovoltaic devices produced in the above Examples 4 to 7 and Comparative Examples 4 to 6, the photoelectric conversion efficiency was measured with a solar simulator (AM 1.5, 100 mW/cm$^2$, surface temperature of 25° C.) to examine their initial characteristics. The results are shown in Table 1. Here, the photoelectric conversion efficiency was evaluated as "AA" when the relative value on the basis of the photoelectric conversion efficiency of Example 4 is 1.00; as "A" when it is 0.95 or more to less than 1.00; as "B" when it is 0.90 or more to less than 0.95; and as "C" when it is less than 0.90.

TABLE 2

| Film formation process | Film formation rate (nm/sec) | | | Film formation rate ratio | | | Photoelectric conversion efficiency |
|---|---|---|---|---|---|---|---|
| | First step | Second step | Third step | Second step/ first step | Third step/ first step | Target (second step) | |
| Example: | | | | | | | |
| 4 Batch method | 0.5 | 10 | 8 | 20 | 16 | pre-sputtered | AA |

TABLE 2-continued

| Film formation process | Film formation rate (nm/sec) | | | Film formation rate ratio | | | Photo-electric conversion efficiency |
|---|---|---|---|---|---|---|---|
| | First step | Second step | Third step | Second step/ first step | Third step/ first step | Target (second step) | |
| 5 Continuous method | 0.5 | 10 | 8 | 20 | 16 | pre-sputtered | AA |
| 6 Batch method | 0.5 | 10 | 10 | 20 | 20 | pre-sputtered | A |
| 7 Batch method | 0.5 | 10 | 8 | 20 | 16 | virgin target | B |
| Comparative Example: | | | | | | | |
| 4 Batch method | 10 | 10 | 10 | 1 | 1 | pre-sputtered | C |
| 5 Batch method | 0.08 | 10 | 8 | 125 | 100 | pre-sputtered | C |
| 6 Continuous method | 10 | 10 | 10 | 1 | 1 | pre-sputtered | C |

As can be seen from Table 2, the photoelectric conversion efficiency is greatly low when the conditions of film formation rate turn aside from the conditions of the present invention as in Comparative Examples 4, 5 and 6.

The photoelectric conversion efficiency is lower than that of Example 4 when the third step is carried out under the same conditions of film formation rate as the second step as in Example 6. Thus, it can be seen that better results are obtainable by making the film formation rate in the third step lower than the film formation rate in the second step.

The photoelectric conversion efficiency is also lower than that of Example 4 when the virgin target is used in the second step as in Example 7. Thus, it can be seen that better results are obtainable by using the target having been subjected to pre-sputtering.

As described above, according to one preferred embodiment of the present invention, the controlling of the ratio of film formation rates for the first and second transparent conductive films when the reflecting film and the first and second transparent conductive films are formed can make higher the film formation rate of the whole transparent conductive film and enables formation of a deposited film promising a good photoelectric conversion efficiency. Thus, this enables production of highly reliable photovoltaic devices at a low cost, and contributes to real spread of solar cells as sources for systematic electric power.

According to another preferred embodiment of the transparent conductive film production process of the present invention, the controlling of film formation rate in each step in the first, second and third steps of forming the transparent conductive film enables formation of a transparent conductive film (1) having an optimum surface profile as the back reflecting film of photovoltaic devices, (2) rejoicing in a high film formation rate and (3) having a dense film quality. Then, the use of this transparent conductive film enables low-cost production of photovoltaic devices having good photoelectric conversion efficiency and high reliability.

What is claimed is:

1. A process for forming on a substrate a transparent conductive film having crystallizability, the process comprising:
   a first step of forming a film at a first film formation rate;
   a second step of forming a film at a second film formation rate; and
   a third step of forming a film at a third film formation rate, with the third step being carried out after the second step,
   wherein the relationship between film formation rates in the respective steps satisfies:

$2 \leq$ (second film formation rate)/(first film formation rate) $\leq 100$;

$2 \leq$ (third film formation rate)/(first film formation rate) $< 100$; and (second film formation rate)>(third film formation rate).

2. The transparent conductive film formation process according to claim 1, wherein, in the first step, nuclei are formed on the substrate, and, in the second step, the film is so formed as to cover the substrate surface and the surfaces of the nuclei over their whole area.

3. The transparent conductive film formation process according to claim 1, wherein, in the first step, the film is formed in a thickness of from 1 nm to 100 nm.

4. The transparent conductive film formation process according to claim 1, wherein, in the second step, the film is formed in a thickness of 5 μm or less.

5. The transparent conductive film formation process according to claim 1, wherein, in the second step, the film is formed in a thickness of 1 μm or less.

6. The transparent conductive film formation process according to claim 1, wherein, in the first step, the first step is carried out such that the average distance between apexes of hills themselves of the film formed in the first step and the average distance between the apexes of hills of the film formed in the first step and the substrate surface are in a ratio of from 1:3 to 4:1.

7. The transparent conductive film formation process according to claim 1, wherein the transparent conductive film is formed by a roll-to-roll method in which a continuous substrate is put across rollers and transported therebetween.

8. The transparent conductive film formation process according to claim 1, wherein, in the third step, the film is formed in a thickness of 5 μm or less.

9. The transparent conductive film formation process according to claim 1, wherein the transparent conductive film is formed by sputtering.

10. The transparent conductive film formation process according to claim 9, wherein, in the second step, a target having been subjected to pre-sputtering is used.

11. A process for producing a photovoltaic device, the process comprising the steps of:

forming a transparent conductive film by the process according to claim 1; and forming a semiconductor layer.

12. A transparent conductive film formed by the process according to claim 1.

13. A photovoltaic device comprising a transparent conductive film formed by the process according to claim 1.

14. The transparent conductive film formation process according to claim 1, wherein the transparent conductive film comprises zinc oxide, tin oxide, indium oxide, titanium oxide, or a composite of any of these oxides.

* * * * *

UNITED STATES PATENT AND TRADEMARK OFFICE
CERTIFICATE OF CORRECTION

PATENT NO. : 6,930,025 B2
DATED : August 16, 2005
INVENTOR(S) : Akiya Nakayama et al.

It is certified that error appears in the above-identified patent and that said Letters Patent is hereby corrected as shown below:

<u>Title page,</u>
Item [56], References Cited, U.S. PATENT DOCUMENTS, "5,453,165 A * 9/1995 Bachmann   136/259" should read -- 5,453,135 A  * 9/1995 Nakagawa et al. 136/259 --.
Item [57], ABSTRACT,
Line 14, "structure" should read -- structures --.

<u>Column 2,</u>
Line 44, "structure" should read -- structures --.

<u>Column 7,</u>
Line 56, "as" should read -- of --.

<u>Column 8,</u>
Line 4, "less" should read -- lower --; and
Line 5, "lower." should read -- less. --.

<u>Column 9,</u>
Line 32, "103*c*)," should read -- 103*c*, --.

<u>Column 10,</u>
Line 53, "(layers 103*a*to" should read -- (layers 103*a* to --.

<u>Column 11,</u>
Line 20, "glowing" should read -- growing --; and
Line 27, "become" should read -- becomes --.

UNITED STATES PATENT AND TRADEMARK OFFICE
CERTIFICATE OF CORRECTION

PATENT NO. : 6,930,025 B2
DATED : August 16, 2005
INVENTOR(S) : Akiya Nakayama et al.

It is certified that error appears in the above-identified patent and that said Letters Patent is hereby corrected as shown below:

Column 16,
Line 14, "30 scam" should read -- 30 sccm --.

Signed and Sealed this

Twenty-first Day of March, 2006

JON W. DUDAS
*Director of the United States Patent and Trademark Office*